United States Patent
Matsuura et al.

(10) Patent No.: US 8,654,043 B2
(45) Date of Patent: Feb. 18, 2014

(54) ORGANIC ELECTROLUMINESCENCE DISPLAY DEVICE AND METHOD FOR DRIVING THE SAME

(71) Applicant: Idemitsu Kosan Co., Ltd., Chiyoda-ku (JP)

(72) Inventors: Masahide Matsuura, Sodegaura (JP); Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/800,685

(22) Filed: Mar. 13, 2013

(65) Prior Publication Data
US 2013/0200346 A1    Aug. 8, 2013

Related U.S. Application Data

(63) Continuation of application No. 13/064,965, filed on Apr. 28, 2011, now Pat. No. 8,471,789, which is a continuation of application No. 11/326,435, filed on Jan. 6, 2006, now Pat. No. 7,956,828, which is a continuation of application No. 10/485,688, filed as application No. PCT/JP02/06889 on Jul. 8, 2002, now Pat. No. 7,034,339.

(30) Foreign Application Priority Data

Aug. 9, 2001  (JP) ................................ 2001-242610

(51) Int. Cl.
*G09G 3/30* (2006.01)

(52) U.S. Cl.
USPC ............................................ 345/76; 313/504

(58) Field of Classification Search
USPC ............................................ 345/76; 313/504
See application file for complete search history.

(56) References Cited

U.S. PATENT DOCUMENTS 5,247,226 A * 9/1993 Sato et al. .................... 313/504
6,046,547 A   4/2000 Nishio et al.
(Continued)

FOREIGN PATENT DOCUMENTS

JP    02-037385    2/1990
JP    03-233891    10/1991
(Continued)

OTHER PUBLICATIONS

Office Action issued Jan. 31, 2012, in Japanese Patent Application No. 2010-025308.
Japanese Journal of Applied Physics, Dec. 15, 1999, vol. 38, No. 12B, pp. L1502-L1504.

*Primary Examiner* — Kevin M Nguyen
(74) *Attorney, Agent, or Firm* — Oblon, Spivak, McClelland, Maier & Neustadt, L.L.P.

(57) ABSTRACT

In an organic electroluminescence display device (30) comprising an organic EL element (26) having a structure wherein an organic luminescent medium (24) is sandwiched between a top electrode (20) and a bottom electrode (22), and a driving circuit (14) for driving the organic EL element (26), the organic luminescent medium (24) comprises a host compound and a triplet-related luminous compound and the driving circuit (14) applies a electric pulse voltage or pulse current having a frequency of 30 Hz or more and a duty ratio of 1/5 or less. In this way, it is possible to provide an organic EL display device which consumes a low electric power and has a long luminous life span, and a method for driving the same.

24 Claims, 5 Drawing Sheets

(56) References Cited

U.S. PATENT DOCUMENTS

| | | |
|---|---|---|
| 6,191,764 B1 | 2/2001 | Kono et al. |
| 6,229,505 B1 | 5/2001 | Fuji |
| 6,396,209 B1 | 5/2002 | Kido et al. |
| 6,420,057 B1 | 7/2002 | Ueda et al. |
| 6,486,601 B1 | 11/2002 | Sakai et al. |
| 6,515,298 B2 | 2/2003 | Forrest et al. |
| 6,686,898 B2 | 2/2004 | Chen et al. |
| 7,034,339 B2 | 4/2006 | Matsuura et al. |
| 7,956,828 B2 | 6/2011 | Matsuura et al. |
| 2002/0045061 A1 | 4/2002 | Hosokawa |
| 2003/0057856 A1 | 3/2003 | Yamauchi et al. |

FOREIGN PATENT DOCUMENTS

| | | |
|---|---|---|
| JP | 04-308687 | 10/1992 |
| JP | 03-521062 | 5/1995 |
| JP | 7-134558 | 5/1995 |
| JP | 11-003048 | 1/1999 |
| JP | 11-354284 | 12/1999 |
| JP | 2001-052873 | 2/2001 |
| JP | 2003-526876 | 9/2003 |
| WO | WO 00/70655 A2 | 11/2000 |

\* cited by examiner

ORGANIC ELECTROLUMINESCENCE DISPLAY DEVICE AND METHOD FOR DRIVING THE SAME

CROSS REFERENCE TO RELATED APPLICATION

The present application is a Continuation of U.S. application Ser. No. 13/064,965, filed Apr. 28, 2011, which is a Continuation of U.S. application Ser. No. 11/326,435, filed Jan. 6, 2006, which is a Continuation of U.S. application Ser. No. 10/485,688 filed on Feb. 3, 2004, which is a 35 U.S.C. §371 national stage patent application of international patent application PCT/JP2002/06889, filed Jul. 8, 2002, which claims priority to JP 2001-242610, filed Aug. 9, 2001.

TECHNICAL FIELD

This invention relates to an organic electroluminescence display device (which may be referred to as an organic EL display device hereinafter), and a method for driving the same. More specifically, the invention relates to an organic EL display device which consumes a low electric power and is capable of obtaining a long luminous life span, and a method for driving the same.

The "EL" described in the present specification is an abbreviation of "electroluminescence".

BACKGROUND ART

Hitherto, there have been known simple driving type organic EL display devices wherein an organic EL element having an organic emitting layer sandwiched between electrodes is driven by means of an XY matrix electrode structure, and the devices are disclosed in, for example, Japanese Patent Application Laid-Open (JP-A) Nos. 2-37385 and 3-233891.

In such a simple driving type organic EL luminous device, the so-called line sequential scanning is performed. Therefore, in the case that the number of scan lines is several hundred, the instantaneous brightness required is several hundred times observation brightness. Consequently, the following problems are caused.

(1) The driving voltage thereof is 2 to 3 times higher than that in the case of direct current constant voltage. For this reason, the luminescence efficiency lowers or the consumption power gets larger.
(2) Since the quantity of flowing electric current instantaneously becomes several hundred times larger, the organic emitting layer is liable to deteriorate.
(3) Since the electric current quantity is very large in the same manner as in the (2), a drop in voltage in wiring of the electrodes gets larger.

Therefore, in order to solve the problems which simple driving type organic EL luminous devices have, suggested is an active driving type organic EL luminous device having a thin film transistor, (which may be referred to as a TFT hereinafter), so as to drive organic EL elements.

Such active driving type organic EL luminous devices have characteristics that the driving voltage thereof is largely lowered, the luminescence efficiency is improved and further the consumption power can be reduced with compared to simple driving type organic EL luminous devices.

However, in the case that an active driving type organic EL luminous device having such advantageous effects has a compound having the light emitting property to which the triplet state contributes (hereinafter referred to as triplet-related compound), for example, an organic luminescent medium containing an iridium complex, a high luminescence brightness is obtained whereas a problem that the luminous life span is short is encountered. That is, in triplet-related compounds, the time when the molecules thereof are excited and relaxed is longer in the case of compounds having the light property related to the singlet state. Hence, electric charge is stored inside, so that the balance between holes and electrons is liable to be destroyed. Thus, according to Japan Journal of Applied Physics, Vol. 38, pp. L1502-L1504 (1999), in the case of an organic EL luminous device having an organic luminescent medium containing an iridium complex, the luminescence efficiency thereof is a value of 40 lumens/W or more under the condition that the luminescence brightness is 500 cd/cm$^2$ but the half life thereof is a short time of 200 hours or less.

Thus, the present inventors made eager investigation on the above-mentioned problems. As a result, it has been found out that an organic EL display device which consumes a low electric power and is drivable for a long time can be provided by driving the device through an appropriately-set driving circuit even if a combination of a host compound with a triplet-related luminous compound is used; accordingly, the display device can be applied to the field of flat panel displays and others.

That is, an object of the present invention is to provide an organic EL display device which consumes a low electric power and gives a less drop in luminescence brightness even when the device is driven for a long time.

Another object of the present invention is to provide a driving method capable of driving such an organic EL display device at a low consumption power for a long time.

DISCLOSURE OF THE INVENTION

According to the present invention, provided is an organic EL display device comprising an organic EL element having a structure wherein an organic luminescent medium comprising a host compound and a phosphorescent luminous compound is sandwiched between a top electrode and a bottom electrode; and a driving circuit for applying a electric pulse current or pulse voltage having a frequency of 30 Hz or more and a duty ratio of 1/5 or less so as to drive the organic EL element.

The organic EL display device having such a structure makes it possible to make consumption power low even if a triplet-related luminous compound is used, and further to make the luminous life span thereof long.

In order to construct the present invention, it is preferable that the present invention has a driving circuit for applying the electric pulse voltage or pulse current to cause the organic luminescent medium to emit luminescence, and subsequently applying a voltage (V2) in the direction reverse to that of the voltage (V1) of the pulse wave applied between the electrodes of the organic electroluminescence element.

The organic EL display device having such a structure makes it possible to make the luminous life span longer since electric charge stored inside can be removed even when a triplet-related luminous compound is used as the organic luminescent medium.

In order to construct the present invention, it is preferable that the organic EL display device of the present invention has a driving circuit for applying the voltage (V2) which is a smaller than the voltage (V1) of the pulse wave and is in the direction reverse to that of the voltage (V1).

The organic EL display device having such a structure makes it possible to make the luminous life span still longer even when a triplet-related luminous compound is used.

In order to construct the present invention, it is preferable that the triplet-related luminous compound is an organic metal complex.

The organic EL display device having such a structure makes it possible to make consumption power lower.

In order to construct the present invention, it is preferable that the organic metal complex comprises at least one metal selected from the group consisting of Ir, Pt, Pd, Ru, Rh, Mo, Re, Pb and Bi.

The organic EL display device having such a structure makes it possible to make consumption power lower.

In order to construct the present invention, it is preferable that the organic EL display device of the present invention comprises a hole barrier layer between the organic luminescent medium and the cathode.

The organic EL display device having such a structure makes it possible to make consumption power lower even if a triplet-related luminous compound is used, and further to make the luminous life span longer.

In order to construct the present invention, it is preferable that the hole barrier layer comprises a phenanthroline derivative.

The organic EL display device having such a structure makes it possible to make consumption power lower even if a triplet-related luminous compound is used, and further to make the luminous life span longer.

In order to construct the present invention, it is preferable that the driving circuit comprises a thin film transistor for controlling the luminescence of the organic EL element.

The organic EL display device having such a structure makes it possible to make consumption power lower even if a triplet-related luminous compound is used, and further to make the luminous life span longer.

Another aspect of the present invention is a method for driving an organic luminescence display device comprising an organic electroluminescence element having a structure wherein an organic luminescent medium is sandwiched between a top electrode and a bottom electrode, comprising applying a electric pulse current or pulse voltage having a frequency of 30 Hz or more and a duty ratio of 1/5 or less by means of a driving circuit, so as to drive the organic electroluminescence element. Preferably, the electric pulse current is applied.

By driving the organic EL display device in this way, a low consumption power is attained even when a triplet-related luminous compound is used, and further the luminous life span can be made longer.

In order to carry out the driving method of the present invention, it is preferable that the driving circuit applies the electric pulse voltage or pulse current to cause the organic luminescent medium to emit luminescence, and subsequently applies a voltage (V2) in the direction reverse to that of the voltage (V1) of the pulse wave applied between the electrodes of the organic electroluminescence element.

By driving the organic EL display device in this way, the luminous life span can be made longer since electric charges stored inside can be effectively removed even when a triplet-related luminous compound is used.

BEST MODES FOR CARRYING OUT THE INVENTION

Figure 1:
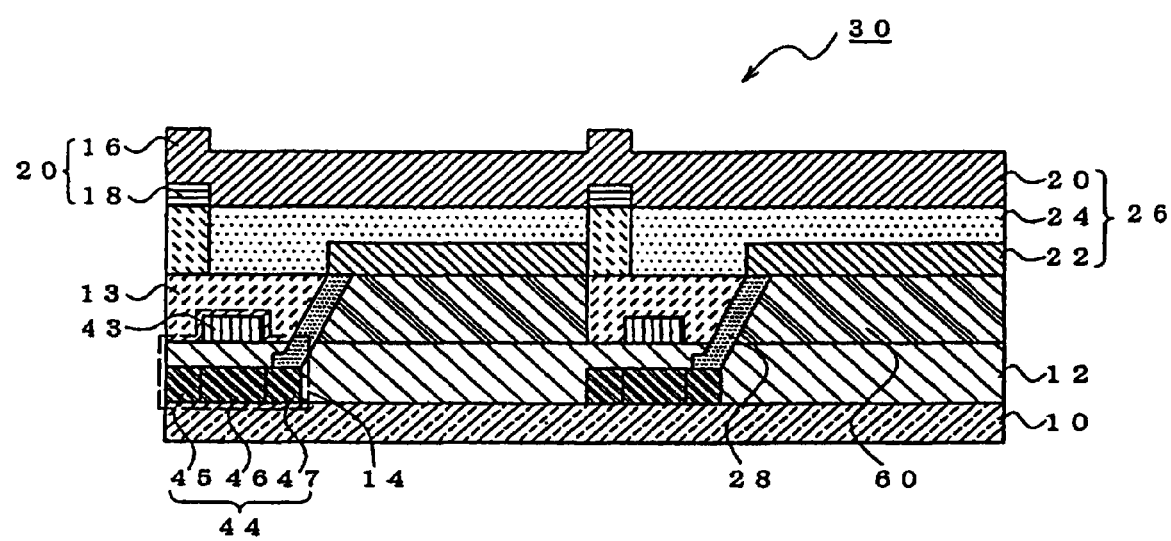
FIG. 1 is a sectional view of an organic EL display device of the present invention.

Referred to the drawings, embodiments of the present invention are specifically described hereinafter. The drawings referred to merely illustrate the size and the shape of respective constituting elements and the arrangement relationship therebetween schematically to such an extent that this invention can be understood. Accordingly, this invention is not limited to illustrated examples only. In the drawings, hatching representing a section may be omitted.

[First Embodiment]

As illustrated in FIG. 1, an organic EL luminous device of a first embodiment is an organic EL display device 30 having an organic EL element 26 wherein an organic luminescent medium 24 is sandwiched between a top electrode 20 and a bottom electrode 22, which are set over a supporting substrate 10, and a driving circuit 14 for driving the organic EL element 26, wherein the organic luminescent medium 24 comprises a host compound and a triplet-related luminous compound, and further the driving circuit 14 can apply an electric pulse voltage (V1) or pulse current having a frequency of 30 Hz or more and a duty ratio of 1/5 or less, the voltage (V1) being applied between the electrodes of the organic EL element 26 at this time.

In FIG. 1, a TFT circuit is set up. However, this TFT circuit may be omitted. Organic EL display devices wherein a TFT circuit is set up are usually driven by direct current whereas the above-mentioned electric pulse voltage or pulse current is applied in the present invention.

About the embodiment of the organic EL luminous device of the present invention, constituting elements thereof, the driving method thereof, and others are described with reference to FIG. 1, and other figures.

1. Supporting Substrate

The support substrate in the organic EL display device, (which may be referred to as the substrate hereinafter), is a member for supporting the organic EL element, the driving circuit, and others. It is therefore preferable that the substrate is excellent in mechanical strength and dimension stability.

Specific examples of such a substrate include a glass plate, a metal plate, a ceramic plate or a plastic plate (such as polycarbonate resin, acrylic resin, vinyl chloride resin, polyethylene terephthalate resin, polyimide resin, polyester resin, epoxy resin, phenol resin, silicon resin or fluorine-containing resin).

In order to avoid the invasion of moisture into the organic EL display device, it is preferable to subject the substrate made of these materials to moisture proof treatment or hydrophobic treatment by forming an inorganic film further or applying a fluorine-containing resin.

Accordingly, in order to avoid the invasion of moisture into the organic luminescent medium, it is preferable to make the water content in the substrate and the gas permeability coefficient thereof small by moisture proofing treatment or hydrophobic treatment. Specifically, it is preferable to set the water content in the supporting substrate and the gas permeability coefficient into 0.0001% by weight or less and $1\times10^{-13}$ or less cc·cm/cm$^2$·sec·cmHg, respectively.

2. Organic EL Element (1) Organic Luminescent Medium

The organic luminescent medium can be defined as a medium containing an organic emitting layer wherein an electron and a hole are recombined with each other so that EL luminescence can be emitted. This organic luminescent medium can be constructed, for example, by laminating the following respective layers on the bottom electrode. The triplet-related luminous compound may be contained in any of the following organic layers.

(i) Organic emitting layer
(ii) Hole transport layer/organic emitting layer
(iii) Organic emitting layer/electron injection layer
(iv) Hole transport layer/organic emitting layer/electron injection layer
(v) Hole transport layer/organic emitting layer/hole barrier layer/electron injection layer
(vi) Hole transport layer/electron barrier layer/organic emitting layer/electron injection layer 1) Construction Material 1

Examples of the luminous material (host compound) in the organic luminescent medium include only one or combinations of two or more selected from carbazole derivatives, p-quaterphenyl derivatives, p-quinquephenyl derivatives, benzothiazole compounds, benzimidazole compounds, benzoxazole compounds, metal-chelated oxynoid compounds, oxadiazole compounds, styrylbenzene compounds, distyrylpyrazine derivatives, butadiene compounds, naphthalimide compounds, perylene derivatives, aldazine derivatives, pyraziline derivatives, cyclopentadiene derivatives, pyrrolopyrrole derivatives, styrylamine derivatives, coumarin compounds, aromatic dimethylidyne compounds, metal complexes each having an 8-quinolinol derivative as a ligand, and polyphenyl compounds.

Among these host compounds, more preferable are 4,4'-bis(2,2-di-t-butylphenylvinyl)biphenyl (abbreviated to DTB-PBBi), 4,4'-bis(2,2-diphenylvinyl)biphenyl (abbreviated to DPVBi), and derivatives thereof as the aromatic dimethylidyne compounds.

The host compound is preferably a compound having a larger singlet excitation energy than the level of the triplet excitation energy obtained by the triplet-related luminous compound so that the host compound can use the triplet excitation energy, and is more preferably a compound having a larger triplet excitation energy than the energy level.

2) Construction Material 2

The phosphorescent luminous compound is a compound which generates phosphorescence. It is sufficient that the phosphorescent luminous compound is a compound which has an excitation state life span of 100 ns or more, and its life span can be measured as a luminescence relaxation component. As the method of measuring the life span, the time dependent measurement of transit luminescent delay can be used.

The phosphorescent luminous compound is preferably a triplet-related compound wherein a triplet state contributes to the step of emitting luminescence. It is particularly preferable to use a compound having at least one metal selected from the group consisting of Ir, Pt, Pd, Ru, Rh, Mo, Re, Pb and Bi as a central metal or central metals, and a CN ligand having a skeleton structure represented by the following formula (1), and a derivative thereof. Preferable is also a complex having mixed ligands wherein one CN ligand or two CN ligands are coordinated and further one Lx (wherein Lx=OO, ON or the like) is coordinated. Examples of the Lx ligand include acetylacetone derivatives (acac) and picoline derivatives (pic). Examples of such a triplet-related luminous compound include only one or combinations of two or more selected from an iridium complex, a platinum complex, a palladium complex, a ruthenium complex, a rubidium complex, molybdenum complex, and a rhenium complex.

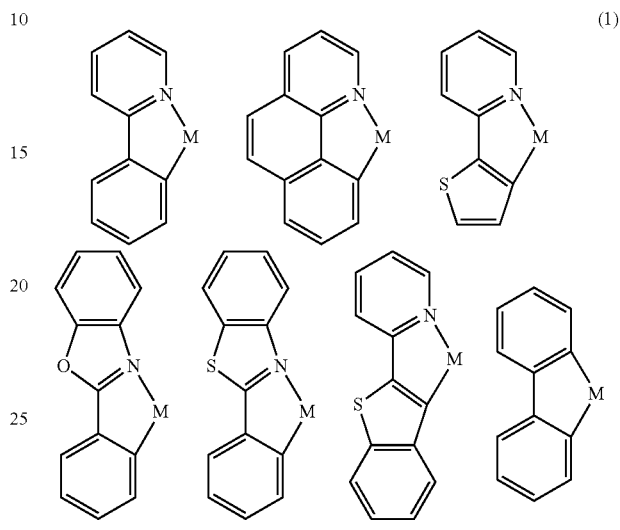

(1)

Among these triplet-related luminous compounds, more specifically, the following are more preferable: tris(2-phenylpyridyl)iridium (abbreviated to Ir(ppy)$_3$), bis(2-phenylpyridyl)platinum, tris(2-phenylpyridyl)palladium, tris(2-phenylpyridyl)ruthenium, tris(2-phenylpyridyl)rubidium, tris(2-phenylpyridyl)molybdenum, Ir(ppy)$_2$(acac), Ir(btp)$_2$(acac), BtpPt(acac), Ir(bo)$_2$(acac), Ir(bt)$_2$(acac), Ir(ppy)$_2$(Pic), and Ir(btp)$_2$(pic).

This is because these triplet-related luminous compounds can give luminescence property related to the triplet state even at room temperature.

These complexes may have a substituent. Examples of the substituent include alkyl groups, fluorine, and aryl groups.

It is preferable to make the ionization potential of the triplet-related luminous compound larger than the ionization potential of the host compound.

This is because such a triplet-related luminous compound causes a hole transferred from the anode to the organic emitting layer to be effectively held inside the organic emitting layer so that the luminescence efficiency can be made higher.

The amount of the added triplet-related luminous compound is preferably set into 0.1 to 50% by weight of the total amount of the organic luminescent medium.

This is because: if the amount of the added triplet-related luminous compound is less than 0.1% by weight, the effect of the addition may not be exhibited; and if the amount of the added triplet-related luminous compound is more than 50% by weight, the half life may become excessively short.

Accordingly, the amount of the added triplet-related luminous compound is more preferably set into 1 to 30% by weight of the total amount of the organic luminescent medium, and still more preferably set into 5 to 20% by weight thereof.

3) Construction Material 3

Examples of hole transport material which constitutes the hole transport layer include only one or combinations of two or more selected from triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, fluorenone derivatives, hydrozone derivatives, styrylanthracene derivatives, stylbene derivatives, silazane derivatives, polysilane, aniline-based copolymers, and conductive high-molecular oligomer (in particular, thiophene oligomer).

More specifically, it is particularly preferable to use, among these hole transport materials, a bis(diarylamino) arylene derivative wherein the aryl is a polyphenyl and the arylene is a polyphenylene since the life span thereof is particularly long.

The polyphenyl is preferably biphenyl or terphenyl, and the polyphenylene is preferably biphenylyl or terphenylyl.

4) Construction Material 4

Examples of electron injection material which constitutes the electron injection layer include only one or combinations of two or more selected from tris(8-quinolinolate) aluminum, tris(8-quinolinolate) gallium, bis(10-benz[h]quinolinolate) beryllium, triazole derivatives, oxadiazole derivatives, triazine derivatives, perylene derivatives, quinoline derivatives, quinoxaline derivatives, diphenylquinone derivatives, nitro-substituted fluorenone derivatives, thiopyrandioxide derivatives.

It is also preferable to add the following as a dopant to this electron injection material: an alkali metal, alkali earth metal, rare earth metal, alkali compound, alkali earth compound, rare earth compound, or alkali metal to which an organic compound coordinates.

5) Thickness

The thickness of the organic luminescent medium is not particularly limited. For example, the thickness is preferably set into 5 nm to 5 μm.

This is because: if the thickness of the organic luminescent medium is less than 5 nm, the luminescence brightness or durability may lower; whereas if the thickness of the organic luminescent medium is more than 5 the value of applying-voltage may become high.

Accordingly, the thickness of the organic luminescent medium is more preferably set into 10 nm to 3 μm, and still more preferably set into 20 nm to 1 μm.

(2) Electrodes

The top electrode and the bottom electrode are described hereinafter. The top electrode and the bottom electrode correspond to an anode layer and a cathode layer, respectively, and a cathode layer and an anode layer, respectively, correspondingly to the structure of the organic EL element.

1) Bottom Electrode

The bottom electrode corresponds to an anode layer or a cathode layer, correspondingly to the structure of the EL display device. For example, in the case that it corresponds to an anode layer, it is preferable to use a metal, alloy or electrically conductive compound which has a large work function (for example, 4.0 eV or more), or a mixture thereof. Specifically, it is preferable to use an electrode material, such as indium tin oxide, indium zinc oxide, strontium copper oxide, tin oxide, zinc oxide, gold, platinum or palladium, alone, or use a combination of two or more of these electrode materials.

By using these electrode materials, the bottom electrode which has a uniform thickness can be formed by a method capable of forming a film in a dry state, such as vapor deposition, sputtering, ion plating, electron beam vapor deposition, CVD (chemical vapor deposition), MOCVD (metal oxide chemical vapor deposition), or plasma CVD (plasma enhanced chemical vapor deposition).

Since EL luminescence has to be taken out from the side of the bottom electrode in the present invention, it is necessary to make the bottom electrode to be a transparent electrode. It is therefore preferable to use the above-mentioned electrode material to set the transmittance of EL luminescence into 70% or more.

The film thickness of the bottom electrode is not particularly limited. For example, the thickness is preferably set into 10 to 1,000 nm, and more preferably set into 10 to 200 nm.

This is because a sufficient electric conductivity is obtained and further a high transmittance of 70% or more is obtained about EL luminescence by setting the film thickness of the bottom electrode into a value within such a range.

2) Top Electrode

Meanwhile, the top electrode also corresponds to an anode layer or a cathode layer, correspondingly to the structure of the EL display device. For example, in the case that it corresponds to a cathode layer, it is preferable to use a metal, alloy or electrically conductive compound which has a smaller work function (for example, less than 4.0 eV) than the anode layer, or a mixture or inclusion thereof.

Specifically, it is preferable to use an electrode material, such as sodium, sodium-potassium alloy, cesium, magnesium, lithium, magnesium-silver alloy, aluminum, aluminum oxide, aluminum-lithium alloy, indium, a rare earth metal, a mixture of these metals and an organic luminescent medium material, or a mixture of these metals and an electron injection layer material, alone, or use a combination of two or more of these electrode materials.

The film thickness of the top electrode is not particularly limited, either. Specifically, the thickness is preferably set into 10 to 1,000 nm, and more preferably set into 10 to 200 nm.

This is because a given sheet resistance and a good electric connection reliability can be obtained by setting the film thickness of the top electrode into a value within such a range.

As illustrated in FIG. 1, the top electrode 20 is preferably composed of a main electrode 16, and an auxiliary electrode 18 made of the material with a lower resistivity.

Such a structure makes it possible to make the sheet resistance of the top electrode 20 remarkably low. Hence, the density of electric current flowing through the organic luminescent medium can be reduced. As a result, the life span of the organic luminescent medium can be made remarkably long.

3. Color Converting Medium

It is also preferable to lay a color converting medium on the luminous surface of the organic EL element. Examples of such a color converting medium include a color filter, and a fluorescent film for emitting light in color different from that of EL luminescence. A combination thereof is also preferable.

(1) Color Filter

The color filter is set up to decompose or filter light, thereby adjusting color or improving contrast, and is made as a dye layer made of only a dye, or as a lamellar matter made by dissolving or dispersing a dye into a binder resin.

About the construction of the color filter, it is preferable to contain dyes in blue, green and red. This is because a combination of such a color filter with an organic EL element which emits white luminescence makes it possible to obtain the three primary colors of light, blue, green and red, and display full color.

It is preferable to use printing or photolithography so as to pattern the color filter in the same manner as in the case of a fluorescence medium.

(2) Fluorescent Medium

The fluorescent mediums in the organic EL display device have a function of absorbing luminescence of the organic EL element to emit fluorescence having a longer wavelength, and are made as a layer which are separately arranged in a planar direction. Respective fluorescent medium pieces are preferably arranged to correspond to luminous areas of the organic EL element, for example, positions of cross portions of the bottom electrode and the top electrode. Such a structure makes it possible that when the organic emitting layer in the cross portions of the bottom electrode and the top electrode emits luminescence, the respective fluorescent medium pieces receive the light and then luminescence in different colors (wavelengths) can be taken out. In particular, such a structure that the organic EL element emits blue luminescence and further the luminescence can be converted to green or red luminescence by the fluorescent medium makes it possible that the three primary colors of light, blue, green and red are obtained even from the single organic EL element and full-color display is attained. Thus, this structure is preferable.

It is also preferable to arrange, between the respective fluorescent medium pieces, a light shielding layer (black matrix) for blocking luminescence of the organic EL element and light from the respective fluorescent medium pieces to improve contrast and decrease the dependency on field angle.

In order to prevent a fall in contrast by external light, the fluorescent medium may be constructed to be combined with the above-mentioned color filter.

4. Driving Circuit (1) Voltage

It is preferable to set the voltage value when voltage is applied (or electric current is injected) into 1 to 20 V.

This is because: if this voltage value is less than 1 V, a desired luminescence brightness is not obtained; whereas if this voltage value is more than 20 V, consumption power may be large.

Accordingly, the voltage value when voltage is applied or electric current is injected is preferably set into 3 to 15 V, and still more preferably set into 8 to 13 V.

(2) Frequency

It is necessary that when voltage is applied or electric current is injected, a pulse wave is used and the frequency thereof is set into 30 Hz or more.

This is because if this frequency is less than 30 Hz, the resultant EL display flickers. However, if the value of the frequency becomes excessively large, a problem may be caused that deterioration of the organic luminescent medium is promoted so that the luminous life span falls.

Accordingly, the frequency when voltage is applied or electric current is injected is preferably set into 40 to 120 Hz, and more preferably set into 50 to 100 Hz.

(3) Duty Ratio

Figure 5:
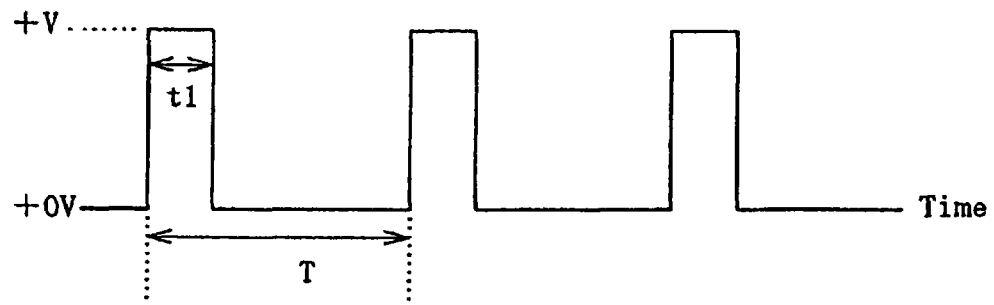
FIG. 5 is a timing chart at the time of applying pulse waves for luminescence.

It is also necessary to set the duty ratio (corresponding to t1/T in FIG. 5) of the pulse wave when voltage is applied (or electric current is injected), into 1/5 or less.

This is because if this duty ratio is more than ⅕, the half life of the organic EL display device is short. However, if this duty ratio becomes excessively small, a problem may be caused that the luminescence brightness lowers.

Accordingly, the duty ratio when voltage is applied or electric current is injected is preferably set into 1/1000 to 1/10, and more preferably set into 1/500 to 1/20.

Figure 2:
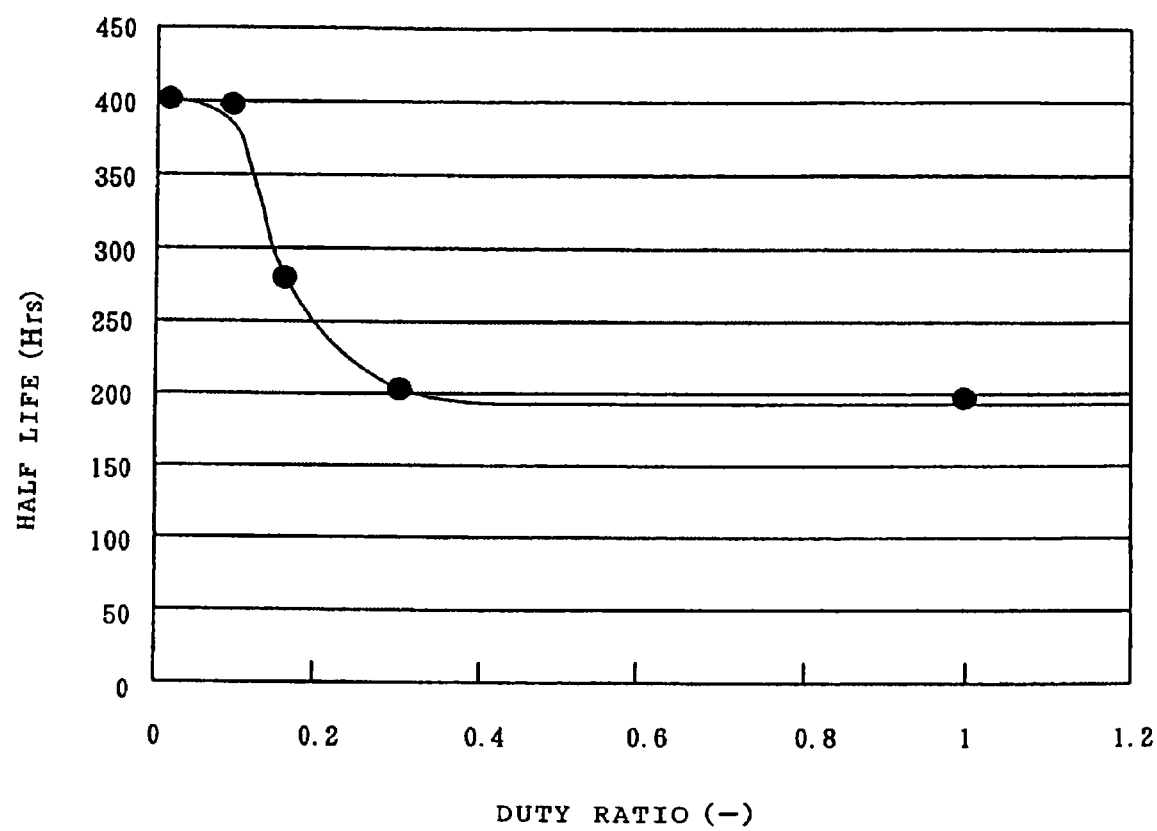
FIG. 2 is a graph showing a relationship between duty ratio and half life.

Referring to FIG. 2, relationship between the duty ratio and the half life is described herein in more detail. As the transverse axis in FIG. 2, the duty ratio (−) is taken and represented, and as the vertical axis, the half life (Hrs) of the organic EL display devices of Example 1 and others is taken and represented.

As is easily understood from FIG. 2, the half life tends to be shorter as the duty ratio is larger. The duty ratio changes largely within a range that the duty ratio is from 0.1 to 0.2. When the half life, which is about 400 Hrs in the case that the duty ratio is 0.1, exceeds 0.2, the half life falls to about 200 Hrs. Conversely, if this duty ratio is set into a value of 1/5 or less, that is, a value of 0.2 or less, a relatively long half life can be obtained. If this duty ratio is set into a value of 0.1 or less, a longer half life can be obtained but the value of the half life tends to be saturated.

Thus, the following conclusion can be obtained from FIG. 2, as well: in order to obtain a long half life, the duty ratio is indispensably set into 1/5 or less, preferably set into 1/1000 to 1/10, and more preferably set into 1/500 to 1/20, as described above. This result is a reason for daring to adopt the above-mentioned duty ratio in active driving, which is originally DC-driven.

(4) Thin Film Transistor (TFT)

1) Structure

As illustrated in FIG. 1, the organic EL display device of the present invention preferably has at least one TFT 14 and an organic EL element 26 driven by this TFT 14 on or over a supporting substrate 10.

That is, an interlayer insulating film 13 and a color converting medium 60, which are made flat, are arranged between the TFT 14 and a bottom electrode 22 of the organic EL element 26, and a drain 47 of the TFT 14 is electrically connected to the bottom electrode 22 of the organic EL element 26 through an electrically connecting member 28 placed in the boundary between the interlayer insulating film 13 and the color converting medium 60.

Figure 3:
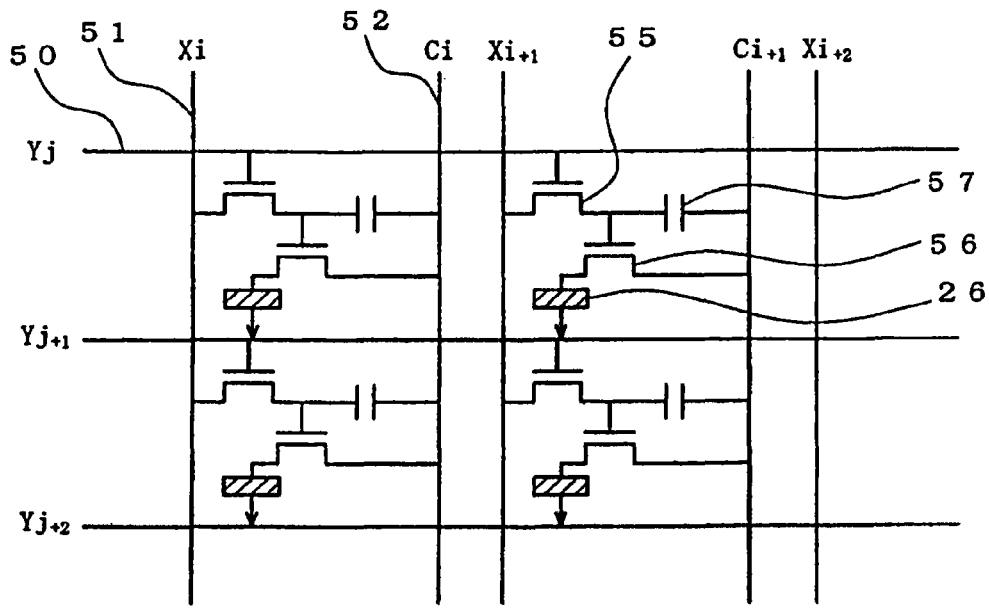
FIG. 3 is a circuit diagram including a TFT.
Figure 4:
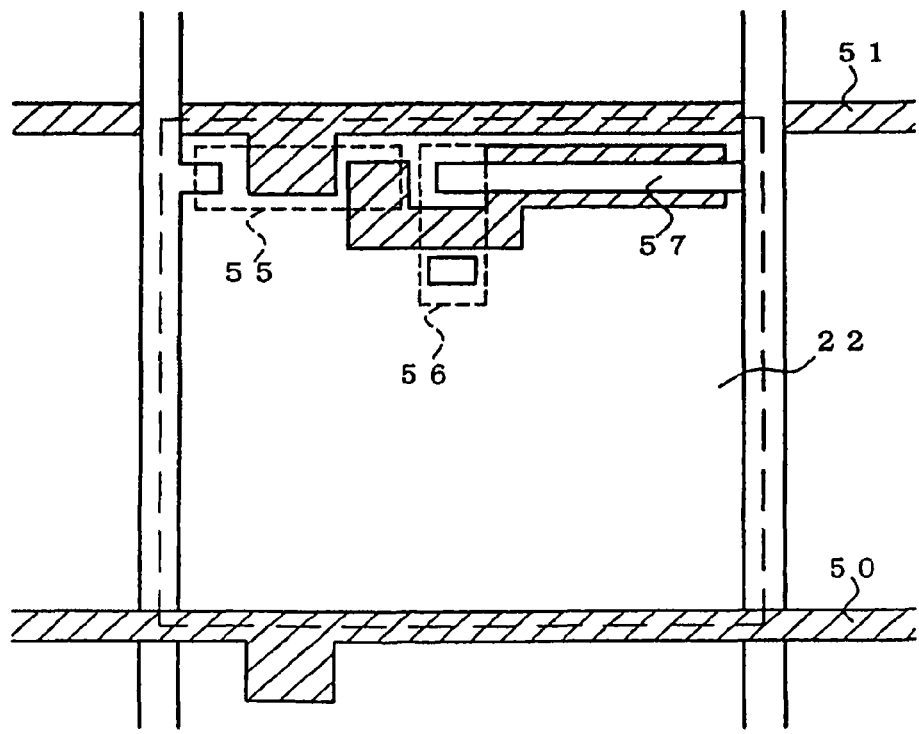
FIG. 4 is a layout diagram including the TFT.

As illustrated in a circuit diagram of FIG. 3 including a TFT and a layout plan of FIG. 4 including the TFT, to the TFT 14 are electrically connected plural scan electrode lines (Yj to Yj+n) 50, (the number of which is n, and n is, for example, from 1 to 1,000), and signal electrode lines (Xi to Xi+n) 51, which are arranged in an XY matrix form. Furthermore, common electrode lines (Ci to Ci+n) 52 laid in parallel to the signal electrode lines 51 are electrically connected to the TFT 14.

It is preferable that these electrode lines 50, 51 and 52 are electrically connected to the TFT 14 and they are combined with condensers 57 to constitute electric switches for driving the organic EL elements 26. In other words, it is preferable that the electric switches are electrically connected to the scan electrode lines 50, the signal electrode lines 51 and others, and are further composed of, for example, one or more first transistors (which may be referred to as Tr1 hereinafter) 55, second transistors (which may be referred to as Tr2 hereinafter) 56, and condensers 57.

It is preferable that the first transistor 55 has a function of selecting a luminous pixel and the second transistor 56 has a function of driving an organic EL element.

As illustrated in FIG. 1, an active layer 44 of the first transistor (Tr1) 55 and the second transistor (Tr2) 56 is composed of semiconductor areas 45 and 47 doped into n type and a non-doped semiconductor area 46, and can be represented by n+/i/n+.

The semiconductor areas doped into the n type become a source 45 and the drain 47, respectively, and they are combined with a gate 43 provided to the upper of the non-doped semiconductor area across a gate oxide film 12 so as to constitute the transistors 55 and 56 as a whole.

In the active layer 44, the semiconductor areas 45 and 47, which are doped into the n type, may be doped into p type to make a structure of p+/i/p+. The active layer 44 of the first transistor (Tr1) 55 and the second transistor (Tr2) 56 is preferably made of an inorganic semiconductor such as polysilicon, or an organic semiconductor such as thiophene oligomer or poly(p-phenylenevinylene). Polysilicon is a particularly preferable material since it is more stable against electric conduction than amorphous Si(.alpha.-Si).

2) Driving Method

The following describes a method for driving organic EL elements based on a TFT. It is preferable that this TFT includes the first transistor (Tr1) 55 and the second transistor (Tr2) 56 and further constitutes an electric switch, as illustrated in FIG. 3.

That is, the electric switch having such a structure makes it possible to input a scan signal pulse and a signal pulse through electrodes in an XY matrix form and perform switching operation, thereby driving the organic EL element 26.

More specifically, through the electric switch, the organic EL element 26 is caused to emit light or the light emission is stopped, whereby an image can be displayed.

When the organic EL elements 26 are driven through the electric switches in this way, a desired one of the first transistors (Tr1) 55 is selected by a scan pulse transmitted through the scan electrode lines (which may be referred to as gate lines) (Yj to Yj+n) 50 and a scan pulse transmitted through the signal electrode lines (Xi to Xi+n) 51, so that a given electric charge is collected in one of the condensers 57 formed between the common electrode lines (Ci to Ci+n) 52 and the source 45 of the first transistor (Tr1) 55.

In this way, the gate voltage of the second transistor (Tr2) 56 turns to a constant value, so that the second transistor (Tr2) 56 turns into an ON-state. In this ON-state, the gate voltage is held until a next gate pulse is transmitted. Accordingly, electric current continues to be supplied to the bottom electrode 22 of the organic EL element 26 connected to the drain 47 of the second transistor (Tr2) 56.

Consequently, the organic EL element 26 can be driven by the supplied electric current. Thus, the driving voltage of the organic EL element 26 can be largely lowered and the luminescence efficiency can be improved. Moreover, the consumption power can be reduced.

5. Sealing Part

It is preferable to provide a sealing part to the organic EL display device. It is preferable to set such a sealing part onto the surrounding of the organic EL display device in order to prevent the invasion of moisture therein, or to insert a known sealing medium, such as a drying agent, a dry gas, or an inert gas such as fluorohydrocarbon, air-tightly between the sealing part set in this way and the organic EL display device.

This sealing part can be used as a supporting substrate in the case that the fluorescent or the color filter is set outside the top electrode.

As this sealing part, the same material as constitutes the supporting substrate, for example, a glass plate can be used. A thin film layer made of oxide, oxynitride, nitride, sulfide or the like may also be used. Preferred examples of this material include $SiO_x$ (1<x≤2), $SiO_xN_y$ (1<x<2, and 0<y<1.5), $AlO_x$ (0.6<x≤1.5), AlON, SiAlON, SiC, and SiCN. (x or y represents a composition ratio, and SiAlON or the like, in which neither x nor y is indicated, represents any composition ratio). The form of the sealing part is not particularly limited. The form is preferably made up, for example, to a plate form or a cap form. For example, when the form is made up to a plate form, the thickness thereof is preferably set into 0.01 to 5 mm.

It is also preferable to make a groove or the like in a part of the organic EL display device, and push and fix the sealing part into it under pressure, or to use a photo-curable type adhesive agent or the like to fix the sealing part onto a part of the organic EL display device.

[Second Embodiment]

A second embodiment is an organic EL display device comprising an organic EL element having a structure wherein an organic luminescent medium is sandwiched between a top electrode and a bottom electrode, and a driving circuit for driving the organic EL element, wherein the organic luminescent medium comprises a host compound and a triplet-related luminous compound; the driving circuit applies a electric pulse voltage or pulse current having a frequency of 30 Hz or more and a duty ratio of 1/5 or less; and further after the driving circuit applies the electric pulse voltage or pulse current to cause the organic luminescent medium to emit luminescence, the driving circuit applies a voltage (V2) in the direction reverse to that of the voltage (V1) of the pulse wave applied between the electrodes of the organic EL element.

About the second embodiment, conditions for applying the reverse direction voltage, and others, which are different from those in the first embodiment, are mainly described hereinafter.

1. Reverse Voltage Value 1

It is preferable that after the driving circuit applies the electric pulse voltage or pulse current to the organic luminescent medium so as to cause the organic luminescent medium to emit luminescence, that is, when the electric pulse voltage or pulse current is not applied, the driving circuit applies a voltage (V2) in the direction reverse to that of the voltage (V1) of the pulse wave applied at the time of emitting the luminescence. For example, in the case that a plus-direction voltage is applied at the time of emitting the luminescence, at the time of not applying this voltage a minus-direction voltage is applied to the organic luminescent medium.

By applying the voltage to the organic EL display device in this way, the consumption power can be made lower and the luminous life span can be made longer even when the triplet-related luminous compound is used. That is, the triplet-related luminous compound has a problem that electric charge is liable to be stored therein and thus the inner electric field intensity thereof changes with the passage of time and balance between holes and electrons is broken, so that the luminescence performance thereof changes easily. Thus, by applying the reverse voltage in this way, the charge stored in the triplet-related luminous compound can be removed.

Hence, by applying the reverse voltage to the organic luminescent medium, the problem of inner storage of charge is overcome even if the triplet-related luminous compound is used. As a result, the consumption power is made lower and the luminous life span can be made longer. In the case that electric current is applied at the time of emitting luminescence, the voltage necessary for giving the electric current is defined as V1.

2. Reverse Voltage Value 2

It is also preferable to set the reverse voltage value when the electric pulse voltage or pulse current is not applied into 0.01 to 15 V.

This is because if this reverse voltage value is less than 0.01 V, the electric charge stored in the triplet-related luminous compound is insufficiently removed so that the effect of the application of the reverse voltage may not be obtained. On the other hand, if this reverse voltage value is more than 15 V, the organic luminescent medium may be deteriorated or destroyed.

Accordingly, the reverse voltage value is preferably set into 0.1 to 10 V, and more preferably set into 0.5 to 5 V.

For the application of the reverse voltage, a direct current and an alternate current (which includes a pulse wave), or either one thereof can be used. The use of a pulse wave is preferable since the electric charge stored in the triplet-related luminous compound can be effectively removed.

About the electric current, a direct current and an alternate current (which includes a pulse wave), or either one thereof can be used.

3. Reverse Voltage Value

It is preferable to decide the absolute value (V2) of the reverse voltage, considering the value of the voltage (V1) applied when the organic luminescent medium emits luminescence. That is, the absolute value (V2) of the reverse voltage is preferably set into 1 to 90% of the voltage (V1) applied when the organic luminescent medium emits luminescence.

This is because if this absolute value of the reverse voltage is less than 1% of the V1, the electric charge stored in the triplet-related luminous compound is insufficiently removed so that the effect of the application of the reverse voltage may not be obtained.

On the other hand, if the absolute value of the reverse voltage is more than 90% of the V1, the organic luminescent medium may be deteriorated or destroyed.

Accordingly, this absolute value of the reverse voltage is preferably set into 5 to 80% of the V1, and more preferably set into 10 to 50% thereof.

4. Frequency

When the reverse voltage is applied, it is preferable to use a pulse wave, as well. In this case, the frequency of the pulse wave is preferably set into 10 to 120 Hz.

This is because if this frequency is less than 10 Hz, a problem may be caused that the stored charge is insufficiently removed. On the other hand, if this frequency is more than 120 Hz, deterioration of the organic luminescent medium is promoted so that the luminous life span may decrease.

Accordingly, the frequency of the pulse wave of the reverse voltage is preferably set into 20 to 100 Hz, and more preferably set into 30 to 80 Hz.

5. Duty Ratio

The duty ratio of the pulse wave when the reverse voltage is applied is preferably set into 1/20 to 1—the duty ratio of the pulse wave in the forward direction.

This is because if this duty ratio is less than 1/20, the charge stored in the triplet-related luminous compound is insufficiently removed so that the effect of the application of the reverse voltage may not be obtained.

On the other hand, this duty ratio cannot be made larger than 1—the duty ratio of the pulse wave in the forward direction.

Accordingly, the duty ratio of the pulse wave when the reverse voltage is applied is preferably set into the above-mentioned range, and more preferably set into 1/10 to 90/100.

6. Applying Timing of the Reverse Voltage

The timing when the reverse voltage is applied is any other time than time when the electric pulse voltage or pulse current is applied to cause the organic EL element to emit luminescence. That is, if the timing is any time when the voltage is not applied, no especial problem is caused whether the timing is any time when the organic EL element continues to emit luminescence or any time when the EL element emits no luminescence.

It is however preferable to apply the reverse voltage in accordance with timing charts shown in FIGS. 6 to 9 since the charge stored in the triplet-related luminous compound can be effectively removed without promoting deterioration of the organic luminescent medium.

Figure 6:
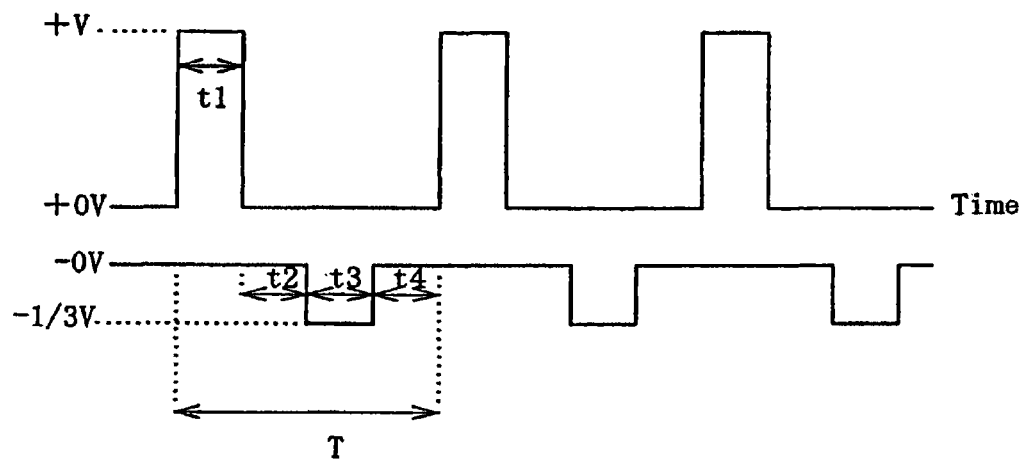
FIG. 6 is a timing chart at the time of applying a reverse voltage.
Figure 7:
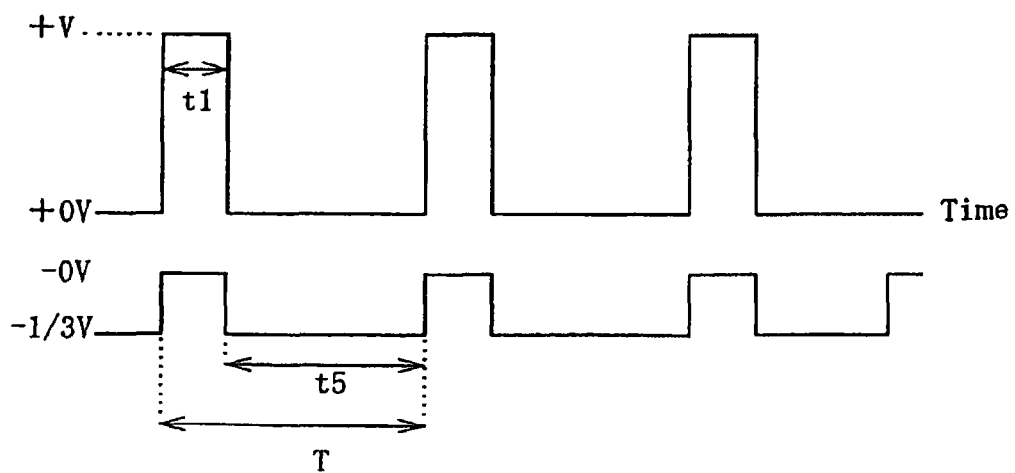
FIG. 7 is a timing chart at the time of applying a reverse voltage.

That is, FIG. 6 shows that: at a time when a voltage is applied in order to cause the organic EL element to emit luminescence and subsequently a time t2 passes, a reverse voltage is applied by a pulse wave for a time t3; and when a time t4 passes further, a voltage is again applied. FIG. 7 shows that over a time t5 when the voltage is not applied to the organic EL element, a DC reverse voltage is applied.

Figure 8:
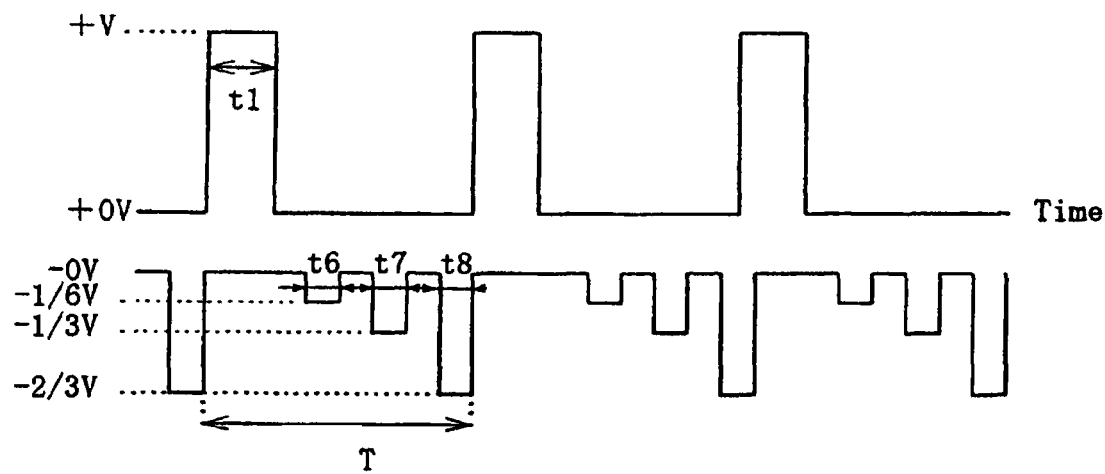
FIG. 8 is a timing chart at the time of applying a reverse voltage.

FIG. 8 shows that when the voltage is not applied to the organic EL element, a reverse voltage is applied plural times by a pulse wave for a time t6, a time t7 and a time t8. In the example shown in FIG. 8, the value of the reverse voltage is made higher as time passes. A fear that the organic luminescent medium is damaged by the reverse voltage becomes small.

Figure 9:
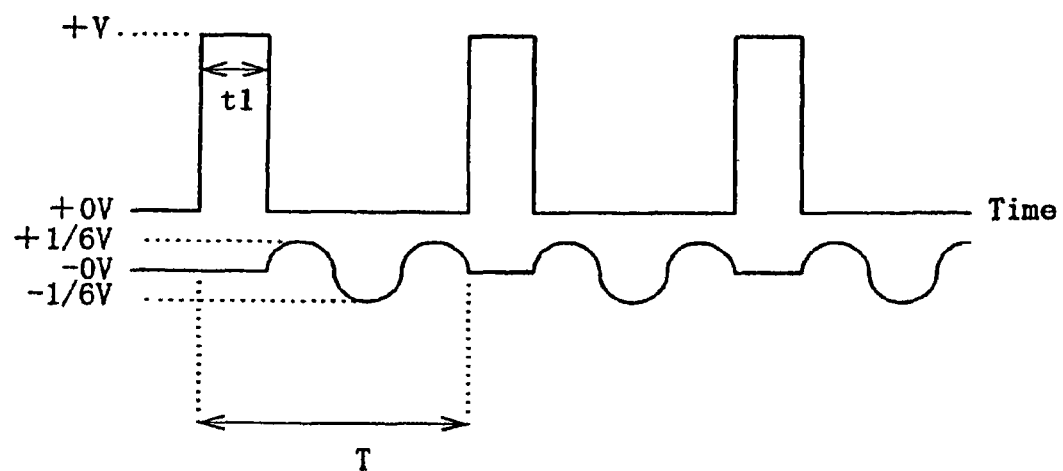
FIG. 9 is a timing chart at the time of applying a reverse voltage.

Furthermore, FIG. 9 shows that when the voltage is not applied to the organic EL element, a reverse voltage of an alternating wave is applied. It is also preferable to combine this alternating wave with the above-mentioned pulse wave appropriately, which is not illustrated.

It is particularly preferable to set the time t2 to not less than 0 and not more than the luminous life span of the triplet-related luminous compound. This is particularly effective for removing the stored charge.

[Third Embodiment]

A third embodiment is an organic EL display device comprising an organic EL element having a structure wherein an organic luminescent medium is sandwiched between a top electrode and a bottom electrode, and a driving circuit for driving the organic EL element, wherein the organic luminescent medium comprises a host compound and a triplet-related luminous compound; the driving circuit applies a electric pulse voltage or pulse current having a frequency of 30 Hz or more and a duty ratio of 1/5 or less; and further a hole barrier layer is arranged between the organic luminescent medium and the cathode.

The hole barrier layer, which is different from the first and second embodiments, is mainly described hereinafter.

1. Kind

It is preferable to use, as the compound which constitutes the hole barrier layer, a compound having a larger ionization potential than the organic emitting layer. In the present invention, it has been recognized that elements having the hole barrier layer particularly have the advantageous effect for removing stored charge. This is because the advantageous effect of the present invention is easily produced since charge is stored in the interface between the organic emitting layer and the hole barrier layer. Examples of compounds, which constitutes such hole barrier layer include phenanthroline derivatives represented by the following formulae (2) to (5):

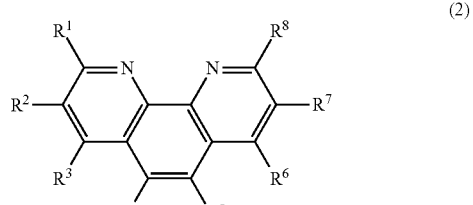

(2)

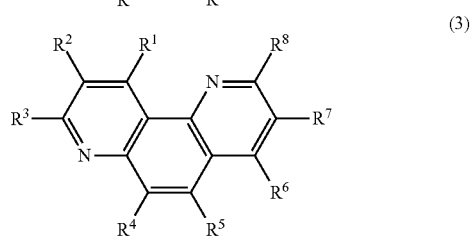

(3)

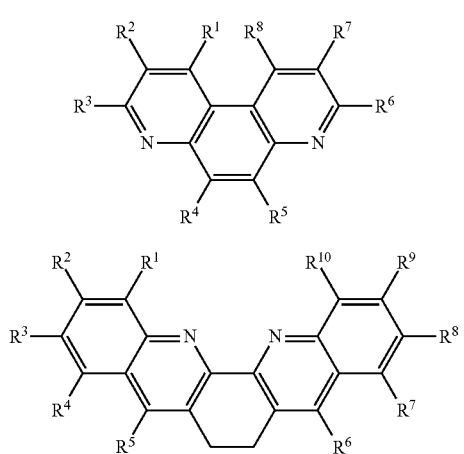

[In each of the formulae, $R^1$ to $R^{10}$ represent a hydrogen, a halogen atom, a hydroxyl group, $NO_2$, CN, or a substituted or unsubstituted alkyl, aryl or amino group.]

Other preferable examples thereof are metal complexes having an 8-hydroxyquinoline derivative as a ligand. Particularly preferable are the metal complexes having an energy gap of 2.8 eV or more.

2. Ionization Potential

In order to exhibit excellent hole barrier property, it is preferable to make the ionization potential of the hole barrier layer larger than that of the organic luminescent medium.

In order to use a triplet-related luminous compound in the organic emitting layer to improve the luminescence efficiency, it is particularly preferable to make the ionization potential of the hole barrier layer 0.1 to 1 eV larger than that of the organic luminescent medium.

3. Thickness

The thickness of the hole barrier layer is not particularly limited. For example, the thickness is preferably set into 1 nm to 1 μm.

This is because: if the thickness of the hole barrier layer is less than 1 nm, the luminescence brightness or durability may lower; and if the thickness of the hole barrier layer is more than 1 the value of applying-voltage may become high.

Accordingly, the thickness of the hole barrier layer is more preferably 3 nm to 500 nm, and still more preferably 5 nm to 100 nm.

4. Formation Method

The method for forming the hole barrier layer is not particularly limited. It is preferable to form the layer by a method such as spin coating, casting or screen printing, or form the layer by a method such as sputtering, vapor deposition, chemical vapor deposition (CVD), or ion plating.

EXAMPLES

Example 1

(1) Formation of an Organic EL Element

1) Formation of an Anode (Bottom Electrode)

An ITO film 130 nm in film thickness was formed on the whole of a glass substrate 112 mm long, 143 mm wide and 1.1 mm thick (OA2 glass, manufactured by Nippon Electric glass Co., Ltd.) by sputtering. A positive resist HRP 204 (manufactured by Fuji Hunt Electronics Technology Co., Ltd.) was applied onto this ITO film by spin coating, and the resultant was dried at a temperature of 80° C. for 15 minutes.

Next, contact exposure using a high-pressure mercury lamp as a light source was performed through a photo mask having a stripe-like pattern (line width: 90 μm, and gap width: 20 μm) in such a manner that the quantity of the exposure would be 100 mJ/cm$^2$. TMAH (tetramethylammonium hydroxide) was used as a developing solution to perform development.

Next, an oven was used to conduct post baking treatment at a temperature of 130° C. and subsequently an aqueous solution of hydrobromic acid (concentration: 47% by weight) was used as an etchant to etch the ITO film. Thereafter, a peeling solution N3O3 (manufactured by Nagase & Co., Ltd.) was used to remove the positive resist, thereby forming an ITO pattern in a stripe form (the number of lines: 960) as an anode (bottom electrode).

2) Formation of a First Interlayer Insulating Film

Next, an acrylic acid type negative resist V259 PA (manufactured by Nippon Steal Chemical Co., Ltd.) was applied onto the ITO pattern by spin coating, and the resultant was dried at a temperature of 80° C. for 15 minutes. Thereafter, contact exposure using a high-pressure mercury lamp as a light source was performed (exposure quantity: 300 mJ/cm$^2$) through a photo mask allowing the ITO to be exposed in the form of 70 μm×290 μm rectangles.

Next, TMAH was used as a developing solution to perform development, and further an oven was used to conduct post baking treatment at a temperature of 160° C. to form a first inter-insulator.

3) Formation of a Second Inter-Insulator

Next, a Novolak resin type negative resist ZPN 1100 (manufactured by Nippon Zeon Co., Ltd.) was applied onto the first inter-insulator by spin coating. The resultant was dried at a temperature of 80° C. for 15 minutes, and then contact exposure using a high-pressure mercury lamp as a light source was performed (exposure quantity: 70 mJ/cm$^2$) through a photo mask giving a stripe-like pattern (line width: 20 μm, and gap width: 310 μm) crossing the ITO pattern, which was the bottom pattern. Next, the resultant was baked at a temperature of 90° C. for 15 minutes.

Next, TMAH was used as a developing solution to perform development, thereby forming a second inter-insulator (line width: 20 μm, gap width: 310 μm, and film thickness: 5 μm) as partition walls.

4) Dehydrating Step

Next, the glass substrate on which the ITO pattern and so on were formed, (which may be referred to merely as the glass substrate hereinafter), was washed with isopropyl alcohol and with ultraviolet rays, and subsequently this glass substrate was shifted to a dehydrating unit for carrying out a dehydrating step. That is, the glass substrate was put into a dry box provided with an inert gas (nitrogen) circulating section, a dew point controlling section, and a heating device section (hot plate).

The hot plate was used to heat the glass substrate inside the dry box up to 60° C., and in this state dry nitrogen was introduced into the box while the dew point was lowered to −50° C. The glass substrate was allowed to stand still for about 2 hours, thereby removing moisture in the first and second inter-insulators and moisture adhering to the surface of the glass substrate and others.

5) Formation of an Organic Luminescent Medium

The heating of the hot plate was stopped so that the temperature of the glass substrate lowered to room temperature. Thereafter, the dew point was kept without exposing the glass substrate to the atmosphere and the glass substrate was fixed onto a substrate holder inside a vacuum deposition machine (manufactured by ULVAC Japan, Ltd.).

The following materials were charged into a heating board made of molybdenum inside the vacuum deposition machine. Hole transport material: 4,4'-bis[N-(1-naphthyl)-N-phenylamino]-biphenyl (abbreviated to NPD hereinafter) Organic luminous material: 4,4'-N,N'-dicarbazolebiphenyl (abbreviated to CBP hereinafter)/tris(2-phenylpyridyl)iridium (abbreviated to Ir(Ppy)$_3$ hereinafter, content by percentage: 8 wt. %) Electron injection material: tris(8-quinolinol)aluminum (abbreviated to Alq hereinafter) Counter electrode (cathode): Al Next, the vacuum degree of the vacuum deposition machine was reduced to 665×10$^{-7}$ Pa (5×10$^{-7}$ Torr), and layers were laminated by vacuum drawing one time without breaking the vacuum state in the middle from the formation of a hole transport layer to the formation of a cathode, so as to form an organic luminescent medium and so on so that a vapor deposition rate and film thickness were as follows:

NPD: a vapor deposition rate of 0.1 to 0.3 nm/second, and a film thickness of 50 nm CBP.Ir(Ppy)$_3$: a vapor deposition rate of 0.1 to 0.3 nm/second, and a total film thickness of 40 nm (CBP and Ir(Ppy)$_3$ were mixed and evaporated.)

Alq: a vapor deposition rate of 0.1 to 0.3 nm/second, and a film thickness of 20 nm Alq.Li: a vapor deposition rate of 0.5 to 1.0 nm/second, and a total film thickness of 10 nm (Alq and Li were mixed and evaporated.)

Al: a vapor deposition rate of 0.5 to 1.0 nm/second, and a film thickness of 150 nm 6) Sealing Step Next, a sealing glass substrate (blue sheet glass, manufactured by Geomatec Co., Ltd.) was laminated on the cathode inside a sealing unit in which dry nitrogen was introduced, and the surrounding thereof was air-tightly covered with a photo-curable type adhesive agent TB 3102 (manufactured by Three Bond Co., Ltd.) to obtain an organic EL display device for measuring luminescence performance.

(2) Evaluation of the Organic EL Element

A pulse current having a frequency of 60 Hz, a duty ratio of 1/10 and a current value of 24 mA/cm$^2$ was applied, from a driving circuit, between the bottom electrode (ITO pattern, anode) of the resultant organic EL display device and the top electrode (cathode) thereof, which was the counter electrode, so as to cause respective pixels (about 230000 pixels), which corresponded to cross points between the electrodes, to emit luminescence. A chroma meter CS 100 (manufactured by Minolta Co., Ltd.) was used to measure the luminescence brightness. As a result, a value of 500 cd/m$^2$ was obtained. The voltage necessary for giving the pulse current at this time was 10 V.

Under the same conditions, the respective pixels of the organic EL device were caused to emit luminescence, and the CIE chromaticity thereof was measured. As a result, it was proved that blue luminescence wherein CIEx=0.30 and CIEy=0.63 in CIE chromaticity coordinates was obtained.

Next, the resultant organic EL display device was left in the atmosphere at room temperature (25° C.), and continuously driven to measure the half life. As a result, the half life was 400 hours.

In conclusion, even if the organic luminescent medium is doped with Ir(Ppy)$_3$, which is a triplet-related luminous compound, the display device can be driven by a voltage of 10 V or less to make consumption power low and further the luminous life span can be made long by using the specific driving circuit.

Example 2

An organic EL element was formed and then a pulse current having a frequency of 60 Hz, a duty ratio of 1/10 and a current value of 20 mA/cm$^2$ was applied thereto from the driving circuit to make an evaluation in the same way as in Example 1 except that a hole barrier layer (film thickness: 10 nm) made of 2,9-dimethyl-4,7-diphenyl-1,10-phenanthroline was laid between the luminous layer and the electron injection layer of the organic EL display device in Example 1.

As a result, the luminous brightness was 500 cd/m$^2$, and the CIE chromaticity was CIEx=0.30 and CIEy=0.63. Furthermore, the half life was 400 hours.

That is, it was proved that by laying the hole barrier layer, the half life, which was 400 hours, did not change but the peak of the voltage was lowered to 8 V to reduce consumption power.

Example 3

The organic EL element was evaluated in the same way as in Example 2 except that the duty ratio of the driving voltage in Example 2 was changed from 1/10 to 1/100, and a pulse current having a frequency of 60 Hz and a current value of 410 mA/cm$^2$ was applied from the driving circuit.

As a result, the luminous brightness was 500 cd/m$^2$, and the CIE chromaticity was CIEx=0.30 and CIEy=0.63. Furthermore, the half life was 400 hours.

That is, by making the duty ratio small, the current value instantaneously became far larger than that in Example 2 but the half life, which was 400 hours, did not change. It is known that in drive wherein the current value instantaneously becomes large so that the duty ratio is large, the life span usually becomes short. However, it was proved that the life span can be kept.

Example 4

The duty ratio of the same driving voltage as in the element in Example 2 was changed from 1/10 to 1/100 and the frequency was changed from 60 Hz to 500 Hz. Furthermore, the organic EL element was evaluated in the same way as in Example 2 except that a pulse voltage (peak voltage: 14 V) was applied.

As a result, the luminous brightness was 500 cd/m$^2$, and the CIE chromaticity was CIEx=0.30 and CIEy=0.63. Furthermore, the half life was 460 hours.

That is, it was proved that even when the duty ratio was made small, the half life became 15% larger than that in Examples 1 and 2 by making the frequency large.

Example 5

The organic EL element was evaluated in the same way as in Example 2 except that a reverse voltage of 1 V was applied when no luminescence was emitted, and a pulse current having a frequency of 60 Hz, a duty ratio of 1/10 and a current value of 20 mA/cm$^2$ was applied from the driving circuit.

As a result, the luminous brightness was 500 cd/m$^2$, and the CIE chromaticity was CIEx=0.30 and CIEy=0.63. Furthermore, the half life was 600 hours.

That is, it was proved that the half life became 50% larger than that in Examples 1 and 2 by applying the reverse voltage.

Example 6

The organic EL element was evaluated in the same way as in Example 2 except that the duty ratio of the driving voltage in Example 2 was changed from 1/10 to 1/7, and a pulse current having a frequency of 60 Hz and a current value of 12 mA/cm$^2$ was applied from the driving circuit.

As a result, the luminous brightness was 500 cd/m$^2$, and the CIE chromaticity was CIEx=0.30 and CIEy=0.63. Furthermore, the half life was 280 hours.

That is, it was proved that the current value was lowered and the half life was lowered by making the duty ratio somewhat large.

Example 7

An organic EL element was formed and then a pulse current having a frequency of 60 Hz, a duty ratio of 1/10 and a current value of 18.5 mA/cm$^2$ was applied thereto from the driving circuit for evaluation in the same way as in Example 2 except that instead of NPD of the hole transport material in Example 2, a bis(arylamino)biphenyl derivative represented by the following formula (6) was used:

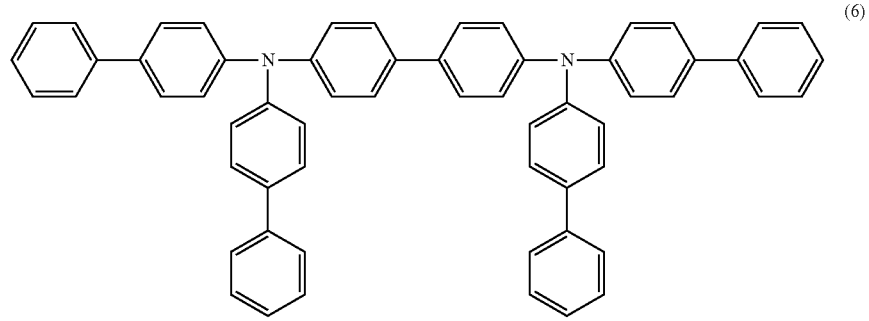 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(6)

As a result, the luminous brightness was 500 cd/m$^2$, and the CIE chromaticity was CIEx=0.30 and CIEy=0.63. Furthermore, the half life was 3,000 hours.

In conclusion, it was proved that the half life can be increased very largely by changing the kind of the organic luminescent medium.

Comparative Example 1

In Example 2, a constant current value of 1.2 mA/cm$^2$ was applied from the driving circuit for evaluation.

As a result, the luminous brightness was 500 cd/m$^2$, and the CIE chromaticity was CIEx=0.30 and CIEy=0.63. However, the half life was 200 hours, which were about 50% of that in Examples 1 and 2.

In conclusion, it was proved that when the duty ratio becomes excessively large (D=1/1), the half life becomes very low correspondingly.

Comparative Example 2

In Example 2, a pulse current having a frequency of 50 Hz, a duty ratio of 1/4 and a current value of 5.8 mA/cm$^2$ was applied from the driving circuit for evaluation.

As a result, the luminous brightness was 500 cd/m$^2$, and the CIE chromaticity was CIEx=0.30 and CIEy=0.63. However, the half life was 200 hours, which were about 50% of that in Examples 1 and 2. In conclusion, it was proved that when the duty ratio becomes excessively large (D=1/4), the half life becomes very low correspondingly.

Industrial Applicability

According to the organic EL display device of the present invention, even when a triplet-related luminous compound is used in its organic luminescent medium, consumption power can be made low and further the luminous life span thereof can be made long.

According to the method for driving an organic EL display device of the present invention, even when an organic EL display device using, in its organic luminescent medium, a triplet-related luminous compound is caused to emit luminescence, consumption power can be made low and further the luminous life span thereof can be made long.

The invention claimed is:

1. An organic electroluminescence display device, comprising:
   an organic electroluminescence element having a structure wherein an organic luminescent medium comprising a host compound and a phosphorescent luminous compound is sandwiched between a top electrode and a bottom electrode;
   a hole barrier layer between the organic luminescent medium and a cathode; and
   a driving circuit configured to drive the organic electroluminescence element,
   wherein the driving circuit is suitable for applying an electric pulse current or pulse voltage between the electrodes of the organic electroluminescence element, and
   the hole barrier layer comprises a phenanthroline derivative or metal complex having an 8-hydroxyquinoline derivative as a ligand.

2. The organic electroluminescence display device according to claim 1,
   wherein the hole barrier layer comprises a phenanthroline derivative of any of formulae (2) to (5):

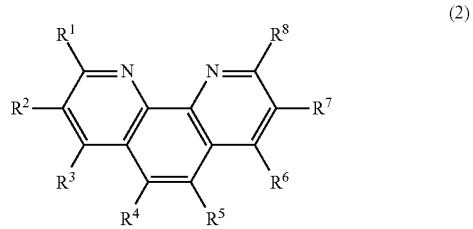

(2)

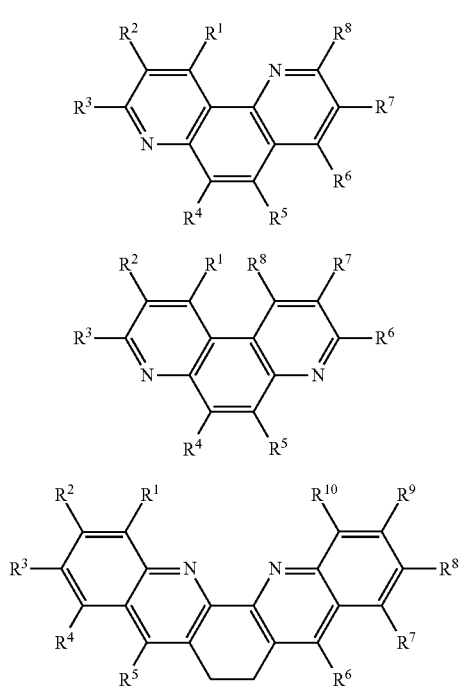

$R^1$ to $R^{10}$ are each independently a hydrogen, a halogen atom, a hydroxyl group, $NO_2$, CN, or a substituted or unsubstituted alkyl, aryl, or amino group.

3. The organic electroluminescence display device according to claim 1,
wherein the hole barrier layer comprises a metal complex having an 8-hydroxyquinoline derivative as a ligand, and
the metal complex has an energy gap of 2.8 eV or more.

4. The organic electroluminescence display device according to claim 1, wherein an ionization potential of the hole barrier layer is larger than an ionization potential of the organic luminescent medium.

5. The organic electroluminescence display device according to claim 1, wherein the host compound is at least one selected from the group consisting of a carbazole derivative, a p-quaterphenyl derivative, a p-quinquephenyl derivative, a benzothiazole compound, a benzimidazole compound, a benzoxazole compound, a metal-chelated oxynoid compound, an oxadiazole compound, a styrylbenzene compound, a distyrylpyrazine derivative, a butadiene compound, a naphthalimide compound, a perylene derivative, an aldazine derivative, a pyraziline derivative, a cyclopentadiene derivative, a pyrrolopyrrole derivative, a styrylamine derivative, a coumarin compound, an aromatic dimethylidyne compound, a metal complex having an 8-quinolinol derivative as a ligand, and a polyphenyl compound.

6. The organic electroluminescence display device according to claim 1, wherein the host compound is at least one selected from the group consisting of 4,4'-bis(2,2-di-t-butylphenylvinyl)biphenyl, 4,4'-bis(2,2-diphenylvinyl)biphenyl, and any derivative thereof.

7. The organic electroluminescence display device according to claim 1, wherein the phosphorescent luminous compound is a compound having a light emitting property to which a triplet state contributes.

8. The organic electroluminescence display device according to claim 7, wherein the phosphorescent luminous compound is an organic metal complex.

9. The organic electroluminescence display device according to claim 8, wherein the organic metal complex comprises at least one metal selected from the group consisting of Ir, Pt, Pd, Ru, Rh, Mo, Re, Pb, and Bi.

10. The organic electroluminescence display device according to claim 1,
wherein the organic luminescent medium comprises an electron injection layer, and
the electron injection layer comprises at least one compound selected from the group consisting of tris(8-quinolinolate) aluminum, tris(8-quinolinolate) gallium, bis(10-benz[h]quinolinolate) beryllium, a triazole derivative, an oxadiazole derivative, a triazine derivative, a perylene derivative, a quinoline derivative, a quinoxaline derivative, a diphenylquinone derivative, a nitro-substituted fluorenone derivative, and a thiopyrandioxide derivative.

11. The organic electroluminescence display device according to claim 1,
wherein the organic luminescent medium comprises a hole transport layer, and
the hole transport layer comprises at least one compound selected from the group consisting of a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a fluorenone derivative, a hydrozone derivative, a styrylanthracene derivative, a stylbene derivative, a silazane derivative, a polysilane, an aniline-based copolymer, and a conductive high-molecular oligomer.

12. An organic electroluminescence display device, comprising:
an organic electroluminescence element having a structure wherein an organic luminescent medium comprising a host compound and a phosphorescent luminous compound is sandwiched between a top electrode and a bottom electrode;
a hole barrier layer between the organic luminescent medium and a cathode; and
a driving circuit configured to drive the organic electroluminescence element,
wherein the driving circuit is suitable for applying an electric pulse current or pulse voltage between the electrodes of the organic electroluminescence element, and
an ionization potential of the hole barrier layer is larger than an ionization potential of the organic luminescent medium.

13. The organic electroluminescence display device according to claim 12,
wherein the hole barrier layer comprises a phenanthroline derivative of any of formulae (2) to (5):

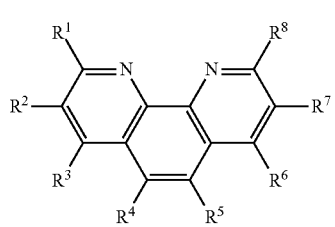

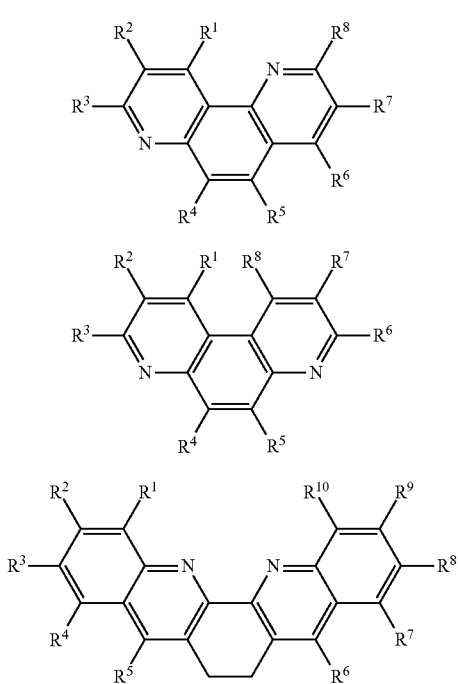

R$^1$ to R$^{10}$ are each independently a hydrogen, a halogen atom, a hydroxyl group, NO$_2$, CN, or a substituted or unsubstituted alkyl, aryl, or amino group.

14. The organic electroluminescence display device according to claim 12,
wherein the hole barrier layer comprises a metal complex having an 8-hydroxyquinoline derivative as a ligand, and
the metal complex has an energy gap of 2.8 eV or more.

15. The organic electroluminescence display device according to claim 12, wherein the host compound is at least one selected from carbazole derivative, a p-quaterphenyl derivative, a p-quinquephenyl derivative, a benzothiazole compound, a benzimidazole compound, a benzoxazole compound, a metal-chelated oxynoid compound, an oxadiazole compound, a styrylbenzene compound, a distyrylpyrazine derivative, a butadiene compound, a naphthalimide compound, a perylene derivative, an aldazine derivative, a pyraziline derivative, a cyclopentadiene derivative, a pyrrolopyrrole derivative, a styrylamine derivative, a coumarin compound, an aromatic dimethylidyne compound, a metal complex having an 8-quinolinol derivative as a ligand, and a polyphenyl compound.

16. The organic electroluminescence display device according to claim 12, wherein the host compound is at least one selected from the group consisting of 4,4'-bis(2,2-di-t-butylphenylvinyl)biphenyl, 4,4'-bis(2,2-diphenylvinyl)biphenyl, and any derivative thereof.

17. The organic electroluminescence display device according to claim 12, wherein the phosphorescent luminous compound is a compound having a light emitting property to which a triplet state contributes.

18. The organic electroluminescence display device according to claim 17, wherein the phosphorescent luminous compound is an organic metal complex.

19. The organic electroluminescence display device according to claim 18, wherein the organic metal complex comprises at least one metal selected from the group consisting of Ir, Pt, Pd, Ru, Rh, Mo, Re, Pb, and Bi.

20. The organic electroluminescence display device according to claim 12,
wherein the organic luminescent medium comprises an electron injection layer, and
the electron injection layer comprises at least one compound selected from the group consisting of tris(8-quinolinolate) aluminum, tris(8-quinolinolate) gallium, bis(10-benz[h]quinolinolate) beryllium, a triazole derivative, an oxadiazole derivative, a triazine derivative, a perylene derivative, a quinoline derivative, a quinoxaline derivative, a diphenylquinone derivative, a nitro-substituted fluorenone derivative, and a thiopyrandioxide derivative.

21. The organic electroluminescence display device according to claim 12,
wherein the organic luminescent medium comprises a hole transport layer, and
the hole transport layer comprises at least one compound selected from the group consisting of a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a fluorenone derivative, a hydrozone derivative, a styrylanthracene derivative, a stylbene derivative, a silazane derivative, a polysilane, an aniline-based copolymer, and a conductive high-molecular oligomer.

22. The organic electroluminescence display device according to claim 21, wherein the hole transport layer comprises a bis(diarylamino)arylene derivative, as an arylamine derivative.

23. The organic electroluminescence display device according to claim 22, wherein an aryl of the bis(diarylamino)arylene derivative is biphenyl or terphenyl.

24. The organic electroluminescence display device according to claim 22, wherein an arylene of the bis(diarylamino)arylene derivative is biphenylyl or terphenylyl.

* * * * *